United States Patent
Minegishi et al.

(10) Patent No.: US 9,029,069 B2
(45) Date of Patent: *May 12, 2015

(54) RESIST UNDERLAYER FILM-FORMING COMPOSITION AND METHOD FOR FORMING PATTERN

(75) Inventors: Shin-ya Minegishi, Tokyo (JP); Yushi Matsumura, Tokyo (JP); Shinya Nakafuji, Tokyo (JP); Kazuhiko Komura, Tokyo (JP); Takanori Nakano, Tokyo (JP); Satoru Murakami, Tokyo (JP); Kyoyu Yasuda, Tokyo (JP); Makoto Sugiura, Tokyo (JP)

(73) Assignee: JSR Corporation, Tokyo (JP)

( * ) Notice: Subject to any disclaimer, the term of this patent is extended or adjusted under 35 U.S.C. 154(b) by 204 days.

This patent is subject to a terminal disclaimer.

(21) Appl. No.: 13/434,781

(22) Filed: Mar. 29, 2012

(65) Prior Publication Data

US 2012/0270157 A1 Oct. 25, 2012

Related U.S. Application Data

(63) Continuation-in-part of application No. 13/221,853, filed on Aug. 30, 2011, now Pat. No. 8,513,133.

(30) Foreign Application Priority Data

Mar. 31, 2011 (JP) ................. 2011-081332

(51) Int. Cl.
*G03F 7/025* (2006.01)
*G03F 7/09* (2006.01)
(52) U.S. Cl.
CPC ..................... *G03F 7/09* (2013.01)
(58) Field of Classification Search
USPC ............... 430/271.1, 323
See application file for complete search history.

(56) References Cited

U.S. PATENT DOCUMENTS

| | | | |
|---|---|---|---|
| 6,683,211 B1 | 1/2004 | Lamberth et al. | |
| 7,749,681 B2 | 7/2010 | Yoshimura et al. | |
| 8,513,133 B2 * | 8/2013 | Minegishi et al. | 438/703 |
| 8,859,185 B2 | 10/2014 | Minegishi et al. | |
| 8,859,191 B2 | 10/2014 | Matsumura et al. | |

FOREIGN PATENT DOCUMENTS

| | | |
|---|---|---|
| JP | 2003-533502 | 11/2003 |
| JP | 2009-014816 | 1/2009 |
| WO | WO 2007/105776 | 9/2007 |

OTHER PUBLICATIONS

U.S. Appl. No. 14/477,306, filed Sep. 4, 2014, Matsumura et al.

* cited by examiner

*Primary Examiner* — Daborah Chacko Davis
(74) *Attorney, Agent, or Firm* — Oblon, McClelland, Maier & Neustadt, L.L.P.

(57) ABSTRACT

A resist underlayer film-forming composition includes a polymer including a structural unit shown by a formula (1), and having a polystyrene-reduced weight average molecular weight of from 3000 to 10000, and a solvent. Each of $R^3$ to $R^8$ independently represents a group shown by a formula (2), a hydrogen atom, a hydroxyl group, an alkyl group having 1 to 6 carbon atoms, an alkoxy group having 1 to 6 carbon atoms, an alkoxycarbonyl group having 2 to 10 carbon atoms, an aryl group having 6 to 14 carbon atoms, or a glycidyl ether group having 3 to 6 carbon atoms, wherein at least one of $R^3$ to $R^8$ represents the group shown by the formula (2).

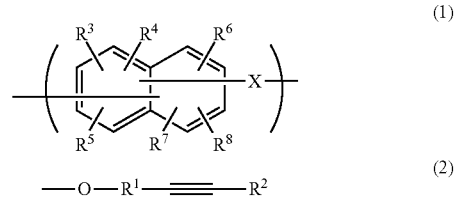

7 Claims, 1 Drawing Sheet

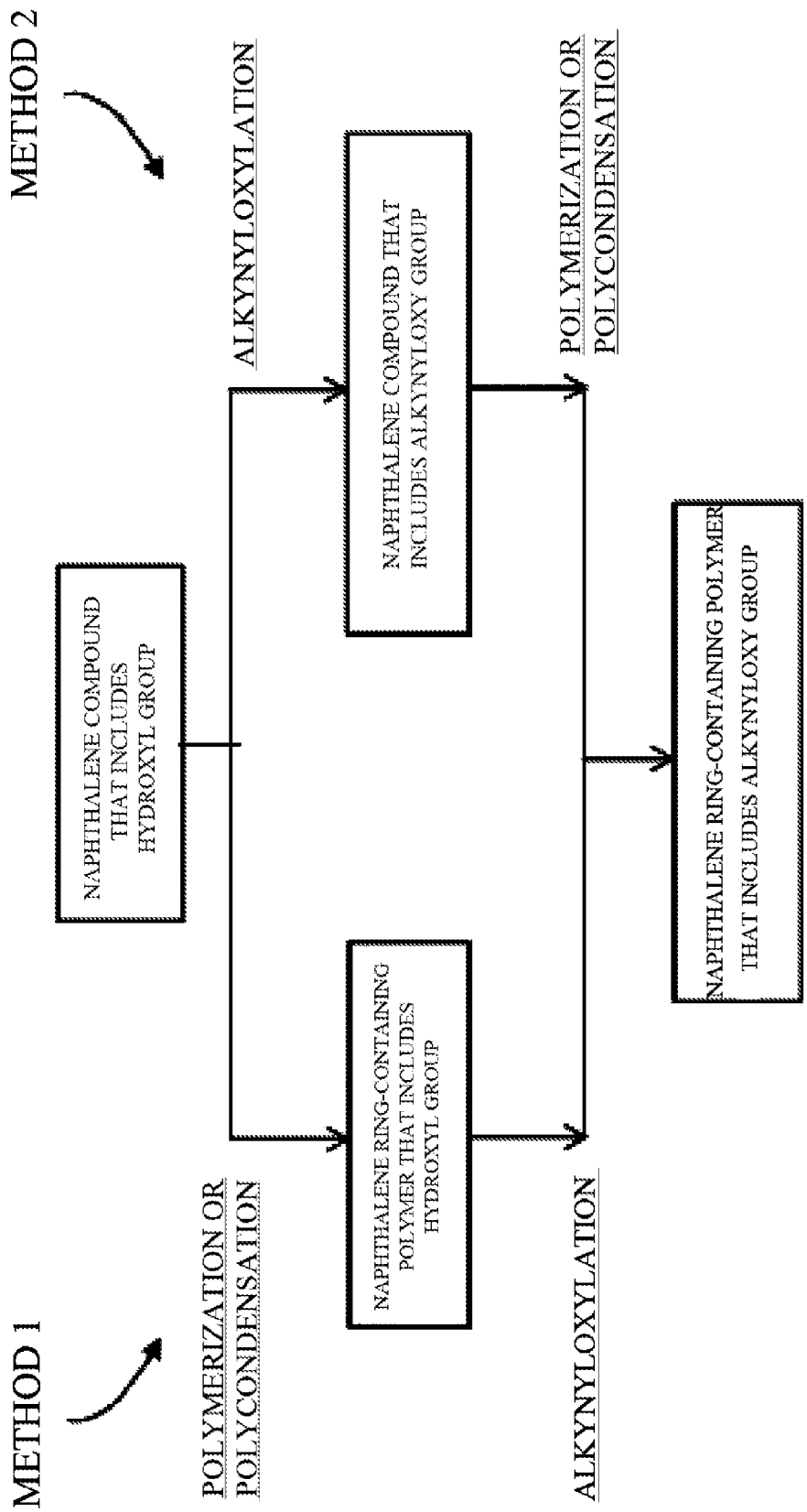

RESIST UNDERLAYER FILM-FORMING COMPOSITION AND METHOD FOR FORMING PATTERN

CROSS-REFERENCE TO RELATED APPLICATIONS

The present application claims priority under 35 U.S.C. §119 to Japanese Patent Application 2011-81332, filed Mar. 31, 2011 and is a continuation-in-part application of the U.S. patent application Ser. No. 13/221,853 filed Aug. 30, 2011, which claims priority to Japanese Patent Application No. 2011-81332, filed Mar. 31, 2011. The contents of these applications are incorporated herein by reference in their entirety.

BACKGROUND OF THE INVENTION

1. Field of the Invention

The invention relates to a resist underlayer film-forming composition and a method for forming a pattern.

2. Discussion of the Background

A semiconductor device production process normally includes forming a resist film on a substrate using a resist composition that includes a photosensitive substance, exposing a given area of the resist film, removing the exposed area or the unexposed area of the resist film by development to form a resist pattern, and dry-etching the substrate using the resist pattern as an etching mask.

Such a process utilizes ultraviolet rays (e.g., ArF excimer laser light) as exposure light used when exposing the resist film. Miniaturization of large-scale integration (LSI) circuits has been increasingly desired, and a resolution equal to or less than the exposure wavelength may be required. In this case, a shortage of the exposure process latitude (e.g., exposure latitude and depth of focus) occurs. It is effective to improve the resolution by reducing the thickness of the resist film in order to compensate for the shortage of the exposure process latitude. However, this makes it difficult to provide the resist film with a thickness necessary for etching the processing target film.

In order to deal with such a problem, a process that forms a resist underlayer film on a substrate, transfers a resist pattern to the resist underlayer film to form an underlayer film pattern, and transfers the resist pattern to the substrate using the underlayer film pattern as an etching mask (hereinafter may be referred to as "multilayer resist process") has been studied. When using the multilayer resist process, it is desirable that the resist underlayer film be formed of a material that exhibits etching resistance. For example, a resist underlayer film-forming composition that contains a polymer that has a side-chain alkynyloxy group has been proposed as a material for forming the resist underlayer film (see Japanese Patent Application Publication (KOKAI) No. 2009-14816).

When subjecting a topological substrate to lithography during the multilayer resist process, it is necessary to planarize the topological substrate by filling depressions formed in the topological substrate. In this case, a resist underlayer film-forming composition may be applied to the topological substrate to form a resist underlayer film, and the resist underlayer film may be planarized. However, since the in-plane depression distribution has become non-uniform due to an increase in aspect ratio (i.e., the ratio of the width (line width) to the thickness of the underlayer film pattern), it has become difficult to achieve planarization while filling depressions. On the other hand, the resist underlayer film-forming composition is required to reduce generation of outgas when forming the resist underlayer film to suppress contamination of the production system.

Therefore, a resist underlayer film-forming composition that can form a resist underlayer film that exhibits excellent etching resistance, exhibits an excellent depression filling capability, and reduces generation of outgas when forming the resist underlayer film, has been desired.

SUMMARY OF THE INVENTION

According to one aspect of the present invention, a resist underlayer film-forming composition includes a polymer and a solvent. The polymer includes a structural unit shown by a formula (1), and has a polystyrene-reduced weight average molecular weight of from 3000 to 10000.

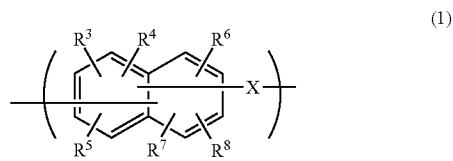

Each of $R^3$ to $R^8$ independently represents a group shown by a formula (2), a hydrogen atom, a hydroxyl group, a substituted or unsubstituted alkyl group having 1 to 6 carbon atoms, a substituted or unsubstituted alkoxy group having 1 to 6 carbon atoms, a substituted or unsubstituted alkoxycarbonyl group having 2 to 10 carbon atoms, a substituted or unsubstituted aryl group having 6 to 14 carbon atoms, or a substituted or unsubstituted glycidyl ether group having 3 to 6 carbon atoms, wherein at least one of $R^3$ to $R^8$ represents the group shown by the formula (2). X represents a substituted or unsubstituted alkanediyl group having 1 to 10 carbon atoms, a substituted or unsubstituted cycloalkanediyl group having 3 to 20 carbon atoms, a substituted or unsubstituted alkanediyloxy group having 1 to 10 carbon atoms, a substituted or unsubstituted cycloalkanediyloxy group having 3 to 20 carbon atoms, a substituted or unsubstituted arenediyl group having 6 to 14 carbon atoms, or a divalent group formed by an arbitrary combination thereof.

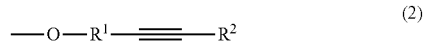

$R^1$ represents a single bond, a substituted or unsubstituted alkanediyl group having 1 to 20 carbon atoms, or a substituted or unsubstituted arenediyl group having 6 to 20 carbon atoms. $R^2$ represents a hydrogen atom, a substituted or unsubstituted alkyl group having 1 to 20 carbon atoms, or a substituted or unsubstituted aryl group having 6 to 20 carbon atoms.

According to another aspect of the present invention, a method for forming a pattern includes providing a resist underlayer film on a substrate using the resist underlayer film-forming composition. A resist film is provided on the resist underlayer film using a resist composition. The resist film is exposed by applying exposure light to the resist film through a photomask. The exposed resist film is developed to form a resist pattern. The resist underlayer film and the substrate are sequentially dry-etched using the resist pattern as a mask.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings.

FIG. 1 is a flowchart illustrating a method that produces a polymer included in a resist underlayer film-forming composition according to one embodiment of the invention.

DESCRIPTION OF THE EMBODIMENTS

According to one embodiment of the invention, a resist underlayer film-forming composition includes (A) a polymer that includes a structural unit shown by a formula (1) (hereinafter may be referred to as "structural unit (I)"), and has a polystyrene-reduced weight average molecular weight (hereinafter may be referred to as "Mw") of 3000 to 10,000 (hereinafter may be referred to as "polymer (A)"), and (B) a solvent,

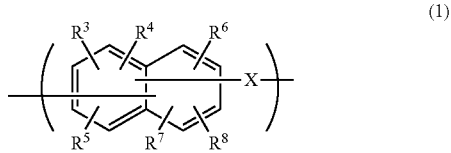

(1)

wherein $R^3$ to $R^8$ independently represent a group shown by a formula (2) (hereinafter may be referred to as "specific substituent (S1)"), a hydrogen atom, a hydroxyl group, a substituted or unsubstituted alkyl group having 1 to 6 carbon atoms, a substituted or unsubstituted alkoxy group having 1 to 6 carbon atoms, a substituted or unsubstituted alkoxycarbonyl group having 2 to 10 carbon atoms, a substituted or unsubstituted aryl group having 6 to 14 carbon atoms, or a substituted or unsubstituted glycidyl ether group having 3 to 6 carbon atoms, provided that at least one of $R^3$ to $R^8$ represents the group shown by the formula (2), and X represents a substituted or unsubstituted alkanediyl group having 1 to 10 carbon atoms, a substituted or unsubstituted cycloalkanediyl group having 3 to 20 carbon atoms, a substituted or unsubstituted alkanediyloxy group having 1 to 10 carbon atoms, a substituted or unsubstituted cycloalkanediyloxy group having 3 to 20 carbon atoms, a substituted or unsubstituted arenediyl group having 6 to 14 carbon atoms, or a divalent group formed by combining arbitrary groups among these groups,

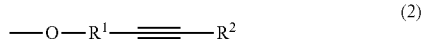

(2)

wherein $R^1$ represents a single bond, a substituted or unsubstituted alkanediyl group having 1 to 20 carbon atoms, or a substituted or unsubstituted arenediyl group having 6 to 20 carbon atoms, and $R^2$ represents a hydrogen atom, a substituted or unsubstituted alkyl group having 1 to 20 carbon atoms, or a substituted or unsubstituted aryl group having 6 to 20 carbon atoms.

Since the resist underlayer film-forming composition includes the polymer (A) and the solvent (B), and the polymer (A) includes the above specific structural unit, and has an Mw within the above specific range, the resist underlayer film-forming composition can form a resist underlayer film that exhibits excellent etching resistance, exhibits an excellent filling capability when using a non-planar substrate, and reduces generation of outgas when forming the resist underlayer film. The reason that the resist underlayer film-forming composition having the above configuration exhibits the above effects has not necessarily been elucidated. For example, it is conjectured that the resist underlayer film-forming composition exhibits the above effects because the polymer (A) that includes the structural unit (I) including the specific substituent (S1) and a naphthalene ring, and has an Mw within the above specific range, exhibits rigidity, fluidity, and low volatility.

It is preferable that the polymer (A) have a dispersity of 1.4 to 5.0.

When the polymer (A) has a dispersity within the above specific range, the fluidity of the polymer (A) is moderately adjusted, so that the filling capability and the outgas suppression capability are further improved.

It is preferable that the resist underlayer film-forming composition further include (C) an acid generator.

When the resist underlayer film-forming composition further includes the acid generator (C), it is possible to suppress poisoning (i.e., a deterioration in pattern shape due to a substance that is generated from a substrate and inhibits a chemical reaction of the resist).

It is preferable that the resist underlayer film-forming composition further include (D) a crosslinking agent.

When the resist underlayer film-forming composition further includes the crosslinking agent (D), the resist underlayer film-forming composition can be cured at a lower temperature when forming a resist underlayer film.

The resist underlayer film-forming composition having the above properties may suitably be used to form a pattern on a non-planar substrate.

According to another embodiment of the invention, a method for forming a pattern includes:
(1) forming a resist underlayer film on a substrate using the resist underlayer film-forming composition according to the embodiment of the invention;
(2) forming a resist film on the resist underlayer film using a resist composition;
(3) exposing the resist film by applying exposure light to the resist film via a photomask;
(4) developing the exposed resist film to form a resist pattern; and
(5) sequentially dry-etching the resist underlayer film and the substrate using the resist pattern as a mask.

It is preferable that the substrate be a non-planar substrate.

According to the method for forming a pattern that utilizes the resist underlayer film-forming composition, a non-planar substrate can be successfully planarized (i.e., a hole, a trench, or the like formed in a non-planar substrate can be successfully filled with the resist underlayer film-forming composition), and generation of outgas when forming the resist underlayer film can be suppressed.

The term "dispersity" used herein refers to the ratio "Mw/Mn". The term "Mw" used herein refers to a polystyrene-reduced weight average molecular weight determined by GPC, and the term "Mn" used herein refers to a polystyrene-reduced number average molecular weight determined by GPC.

Examples of a group that is included in the term "substituent" used herein include -$R^{S1}$, -$R^{S2}$—O-$R^{S1}$, -$R^{S2}$—CO-$R^{S1}$, -$R^{S2}$—CO—OR-$R^{S1}$, -$R^{S2}$—O—CO-$R^{S1}$, -$R^{S2}$—OH, -$R^{S2}$—CN, and the like (wherein $R^{S1}$ represents an alkyl group having 1 to 10 carbon atoms, a cycloalkyl group having 3 to 20 carbon atoms, or an aryl group having 6 to 30 carbon atoms, provided that some or all of the hydrogen atoms of these groups may be substituted with a fluorine atom, and $R^{S2}$ represents a single bond, an alkanediyl group having 1 to 10 carbon atoms, a cycloalkanediyl group having 3 to 20 carbon atoms, or an arenediyl group having 6 to 30 carbon atoms, provided that some or all of the hydrogen atoms of these groups may be substituted with a fluorine atom).

The expression "substituted with a substituent" used herein means that a group is substituted with one or more of one type of substituent, or substituted with one or more of each of a plurality of types of substituent.

The resist underlayer film-forming composition and the method for forming a pattern can form a resist underlayer film that exhibits excellent etching resistance, achieve an excellent filling capability when using a non-planar substrate, and reduce generation of outgas when forming the resist underlayer film. Therefore, the resist underlayer film-forming composition and the method for forming a pattern are expected to achieve an increase in yield during microfabrication employed in a lithographic process (particularly production of integrated circuit devices).

Exemplary embodiments of the invention are described below. Note that the invention is not limited to the following exemplary embodiments.

Resist Underlayer Film-Forming Composition

A resist underlayer film-forming composition according to one embodiment of the invention includes (A) a polymer and (B) a solvent. The resist underlayer film-forming composition may preferably include (C) an acid generator and (D) a crosslinking agent, and may include an additional optional component as long as the effects of the invention are not impaired. Each component is described below.

Polymer (A)

The polymer (A) includes a structural unit (I), and has an Mw of 3000 to 10,000.

Structural Unit (I)

The structural unit (I) is shown by the formula (1).

$R^3$ to $R^8$ in the formula (1) independently represent the specific substituent (S1), a hydrogen atom, a hydroxyl group, a substituted or unsubstituted alkyl group having 1 to 6 carbon atoms, a substituted or unsubstituted alkoxy group having 1 to 6 carbon atoms, a substituted or unsubstituted alkoxycarbonyl group having 2 to 10 carbon atoms, a substituted or unsubstituted aryl group having 6 to 14 carbon atoms, or a substituted or unsubstituted glycidyl ether group having 3 to 6 carbon atoms, provided that at least one of $R^3$ to $R^8$ represents the specific substituent (S1). X in the formula (1) represents a substituted or unsubstituted alkanediyl group having 1 to 10 carbon atoms, a substituted or unsubstituted cycloalkanediyl group having 3 to 20 carbon atoms, a substituted or unsubstituted alkanediyloxy group having 1 to 10 carbon atoms, a substituted or unsubstituted cycloalkanediyloxy group having 3 to 20 carbon atoms, a substituted or unsubstituted arenediyl group having 6 to 14 carbon atoms, or a divalent group formed by combining arbitrary groups among these groups.

Examples of the alkyl group represented by $R^3$ to $R^8$ include a methyl group, an ethyl group, an n-propyl group, an i-propyl group, an n-butyl group, an i-butyl group, a sec-butyl group, a t-butyl group, an n-pentyl group, an n-hexyl group, and the like.

Examples of the alkoxy group represented by $R^3$ to $R^8$ include a methoxy group, an ethoxy group, an n-propoxy group, an i-propoxy group, an n-butoxy group, an i-butoxy group, a sec-butoxy group, a t-butoxy group, an n-pentyloxy group, an n-hexyloxy group, and the like.

Examples of the alkoxycarbonyl group represented by $R^3$ to $R^8$ include a methoxycarbonyl group, an ethoxycarbonyl group, an n-propoxycarbonyl group, an i-propoxycarbonyl group, an n-butoxycarbonyl group, an i-butoxycarbonyl group, a sec-butoxycarbonyl group, a t-butoxycarbonyl group, an n-pentyloxycarbonyl group, an n-hexyloxycarbonyl group, and the like.

Examples of the aryl group represented by $R^3$ to $R^8$ include a phenyl group, a tolyl group, a xylyl group, a mesityl group, a naphthyl group, a methylnaphthyl group, an anthryl group, a methylanthryl group, and the like.

Examples of a substituent that may substitute the alkyl group, the alkoxy group, the alkoxycarbonyl group, the aryl group, and the glycidyl ether group include a halogen atom (e.g., fluorine atom, chlorine atom, bromine atom, and iodine atom), a hydroxyl group, a cyano group, a carboxyl group, a nitro group, an amino group, an alkoxy group, an alkoxycarbonyl group, an acyl group, an alkoxycarbonyloxy group, an aryl group, an aliphatic heterocyclic group (e.g., lactone group), a furyl group, an aromatic heterocyclic group (e.g., pyridyl group), and the like.

$R^3$ to $R^8$ preferably represent a hydrogen atom or a hydroxyl group.

Examples of the alkanediyl group represented by X include a methanediyl group, an ethanediyl group, a propanediyl group, a butanediyl group, a pentanediyl group, a hexanediyl group, an octanediyl group, a decanediyl group, and the like. Among these, a methylene group and an ethylene group are preferable.

Examples of the cycloalkanediyl group represented by X include monocyclic cycloalkanediyl groups such as a cyclopropanediyl group, a cyclobutanediyl group, a cyclopentanediyl group, a cyclohexanediyl group, a cycloheptanediyl group, a cyclooctanediyl group, a cyclodecanediyl group, a methylcyclohexanediyl group, and an ethylcyclohexanediyl group;

polycyclic cycloalkanediyl groups such as a bicyclo[2.2.1]heptanediyl group, a bicyclo[2.2.2]octanediyl group, a tricyclo[5.2.1.0$^{2,6}$]decanediyl group (dicyclopentylene group), a tricyclo[3.3.1.1$^{3,7}$]decanediyl group, a tetracyclo[6.2.1.1$^{3,6}$.0$^{2,7}$]dodecanediyl group, and an adamantanediyl group; and the like.

Among these, a tricyclo[5.2.1.0$^{2,6}$]decanediyl group is preferable.

Examples of the arenediyl group represented by X include a phenylene group, a naphthylene group, and the like.

Examples of the alkanediyloxy group represented by X include a group formed by combining an alkanediyl group and an oxygen atom, and the like. Examples of the cycloalkanediyloxy group represented by X include a group formed by combining a cycloalkanediyl group and an oxygen atom, and the like.

Examples of the divalent group formed by combining arbitrary groups among the above groups include a group formed by combining an alkanediyl group and a cycloalkanediyl group, a group formed by combining an alkanediyl group and an arenediyl group, and the like.

Examples of a substituent that may substitute the alkanediyl group, the cycloalkanediyl group, the alkanediyloxy group, the cycloalkanediyloxy group, and the arenediyl group include those mentioned above in connection with $R^3$ to $R^8$, and the like.

A furyl group is preferable as a substituent that may substitute the alkanediyl group.

Examples of the group represented by X include the groups shown by the following formulas, and the like.

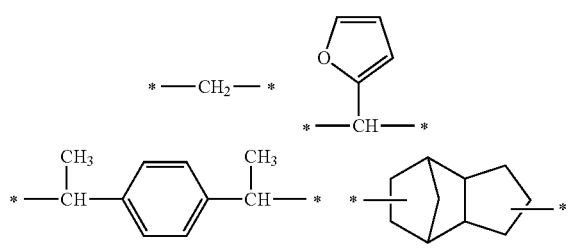

wherein "*" indicates a bonding hand.

X preferably represents a methylene group.

Specific Substituent (S1)

The specific substituent (S1) is shown by the formula (2).

Examples of the alkanediyl group represented by $R^1$ include a methanediyl group, an ethanediyl group, a propanediyl group, a butanediyl group, a pentanediyl group, a hexanediyl group, an octanediyl group, a decanediyl group, a tetradecanediyl group, an octadecanediyl group, an icosanediyl group, and the like.

Examples of the arenediyl group represented by $R^1$ include a benzenediyl group, a methylbenzendiyl group, a naphthalenediyl group, a methylnaphthalenediyl group,
an anthracenediyl group, a methylanthracenediyl group, and the like.

Examples of the alkyl group represented by $R^2$ include a methyl group, an ethyl group, an n-propyl group, an i-propyl group, an n-butyl group, an i-butyl group,
a sec-butyl group, a t-butyl group, an n-pentyl group, an n-hexyl group, an n-octyl group, an n-decyl group, an n-tetradecyl group, an n-octadecyl group, an n-icosyl group, and the like.

Examples of the aryl group represented by $R^2$ include a phenyl group, a tolyl group, a xylyl group, a mesityl group, a naphthyl group, a methylnaphthyl group,
an anthryl group, a methylanthryl group, and the like.

Examples of a substituent that may substitute the alkanediyl group, the arenediyl group, the alkyl group, and the aryl group include those mentioned above in connection with $R^3$ to $R^8$, and the like.

$R^1$ preferably represents a single bond or a methylene group, and more preferably represents a methylene group.

$R^2$ preferably represents a hydrogen atom.

Specific examples of the specific substituent (S1) include alkynyloxy groups such as an ethynyloxy group, a (prop-1-yn-1-yl)oxy group, a (prop-2-yn-1-yl)oxy group, a (but-1-yn-1-yl)oxy group, a (but-3-yn-1-yl)oxy group, a (1-methylprop-2-yn-1-yl)oxy group, a (pent-1-yn-1-yl)oxy group, a (pent-4-yn-1-yl)oxy group, a (hex-1-yn-1-yl)oxy group, a (hex-5-yn-1-yl)oxy group, a (hept-1-yn-1-yl)oxy group, a (hept-6-yn-1-yl)oxy group, an (oct-1-yn-1-yl)oxy group, an (oct-7-yn-1-yl)oxy group, a (non-1-yn-1-yl)oxy group, a (non-8-yn-1-yl)oxy group, a (dec-1-yn-1-yl)oxy group, a (dec-9-yn-1-yl)oxy group, an (undec-1-yn-1-yl)oxy group, an (undec-10-yn-1-yl)oxy group, a (dodec-1-yn-1-yl)oxy group, a (dodec-11-yn-1-yl)oxy group, a (tridec-1-yn-1-yl)oxy group, a (tridec-12-yn-1-yl)oxy group, a (tetradec-1-yn-1-yl)oxy group, a (tetradec-13-yn-1-yl)oxy group, a (pentadec-1-yn-1-yl)oxy group, a (pentadec-14-yn-1-yl)oxy group, a (hexadec-1-yn-1-yl)oxy group, a (hexadec-15-yn-1-yl)oxy group, a (heptadec-1-yn-1-yl)oxy group, and a (heptadec-16-yn-1-yl)oxy group.

Among these, a (prop-2-yn-1-yl)oxy group is preferable.

The structural unit (I) preferably includes one or two specific substituents (S1).

The structural units shown by the following formulas are preferable as the structural unit (I).

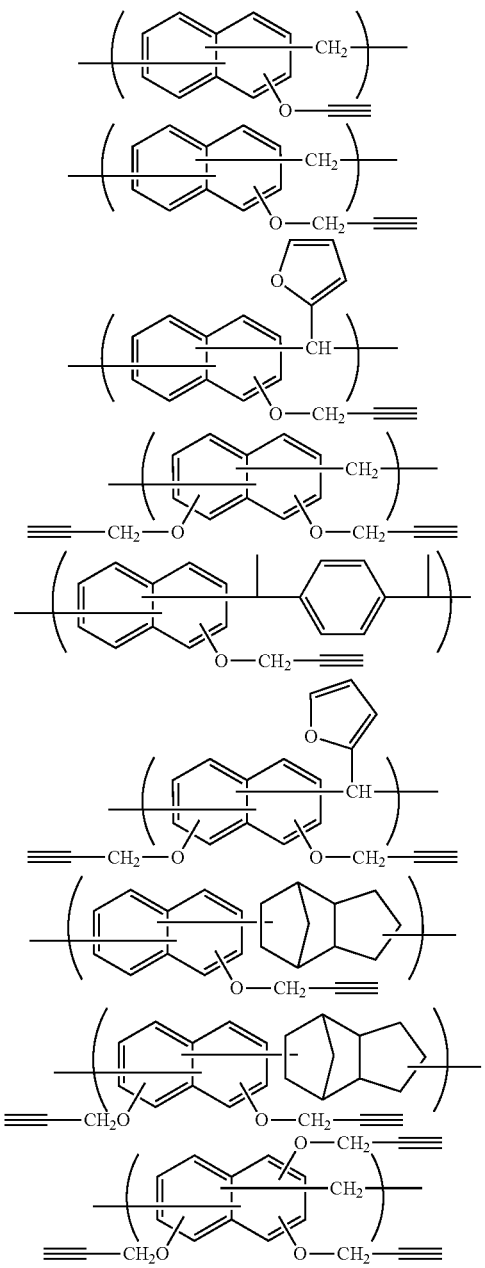

Mw

The polymer (A) has an Mw of 3000 to 10,000. The polymer (A) preferably has an Mw of 3000 to 5000. If the Mw of the polymer (A) is less than 3000, the amount of sublimates may increase when forming a resist underlayer film due to an increase in the content of low-molecular-weight components in the resist underlayer film-forming composition, so that the amount of outgas may increase. If the Mw of the polymer (A) exceeds 10,000, the filling capability may deteriorate since the composition may lose fluidity. If the Mw of the polymer (A) is within the above range, the resulting resist underlayer film-forming composition generates only a small amount of outgas when forming a resist underlayer film, and exhibits an excellent filling capability.

Dispersity

The polymer (A) preferably has a dispersity of 1.4 to 5.0, and more preferably 1.5 to 3.5. If the dispersity of the polymer (A) is less than 1.4 (is close to 1), the filling capability may deteriorate. Specifically, it is conjectured that the space between aggregates of the polymer is not sufficiently filled up when the dispersity of the polymer (A) is less than 1.4. If the dispersity of the polymer (A) exceeds 5.0, the amount of sublimates may increase when forming a resist underlayer film. Specifically, it is conjectured that the content of low-molecular-weight components in the composition increases when the dispersity of the polymer (A) exceeds 5.0. If the dispersity of the polymer (A) is within the above range, sublimation that may occur when forming a resist underlayer film can be more effectively suppressed, so that the filling capability can be further improved.

Synthesis of Polymer (A)

The polymer (A) may be obtained by a method 1 or 2 illustrated in FIG. 1. Specifically, a naphthalene compound that includes a hydroxyl group (hereinafter may be referred to as "compound (N1)") is polymerized, or polycondensed with an appropriate condensation agent (e.g., aldehyde, ketone, or divinyl compound) to obtain a naphthalene ring-containing polymer that includes a hydroxyl group (hereinafter may be referred to as "polymer (P1)"), and the polymer (P1) is alkynyloxylated using a compound that includes a leaving group corresponding to the specific substituent (S1) (hereinafter may be referred to as "alkynylation agent") to obtain the polymer (A) (method 1). Alternatively, a naphthalene compound that includes the specific substituent (S1) obtained by reacting the compound (N1) with the alkynylation agent (hereinafter may be referred to as "compound (N2)") is polymerized, or polycondensed with an appropriate condensation agent (e.g., aldehyde, ketone, or divinyl compound) to obtain the polymer (A) (method 2).

Method 1

The method 1 includes subjecting the compound (N1) to radical polymerization, cationic polymerization, anionic polymerization, or polycondensation with the condensation agent (e.g., aldehyde, ketone, or divinyl compound) to obtain the polymer (P1) that includes a hydroxyl group, and alkynyloxyating the polymer (P1) using the alkynylation agent.

Compound (N1)

Examples of the compound (N1) include naphthols such as 1-naphthol, 2-naphthol, 2-methyl-1-naphthol, 4-methoxy-1-naphthol, 7-methoxy-2-naphthol, 1,5-dihydroxynaphthalene, 1,7-dihydroxynaphthalene, 2,3-dihydroxynaphthalene, 2,6-dihydroxynaphthalene, 2,7-dihydroxynaphthalene, and binaphthol, and the like.

Among these, 1-naphthol, 4-methoxy-1-naphthol, 7-methoxy-2-naphthol, 1,5-dihydroxynaphthalene, 1,7-dihydroxynaphthalene, and 2,7-dihydroxynaphthalene are preferable, and 1-naphthol and 2,7-dihydroxynaphthalene are more preferable.

Examples of the aldehyde that may be used as the condensation agent include formaldehyde, trioxane, paraformaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, and the like.

Examples of the ketone that may be used as the condensation agent include acetone, methyl ethyl ketone, methyl isobutyl ketone, and the like. Examples of the divinyl compound that may be used as the condensation agent include divinylbenzene, dicyclopentadiene, tetrahydroindene, 4-vinylcyclohexene, 5-vinylnorborn-2-ene, α-pinene, β-pinene, limonene, 5-vinylnorbornadiene, and the like.

Among these, the aldehyde is preferable, and formaldehyde and furfural are more preferable.

When using the aldehyde as the condensation agent, the aldehyde is preferably used in an amount of 1 to 1000 parts by mass, and more preferably 10 to 100 parts by mass, based on 100 parts by mass of the compound (N1).

The compound (N1) may be subjected to polycondensation with the condensation agent in the presence of an acid catalyst. Examples of the acid catalyst include mineral acids such as sulfuric acid, phosphoric acid, and perchloric acid; organic sulfonic acids such as p-toluenesulfonic acid; carboxylic acids such as formic acid and oxalic acid; and the like.

The acid catalyst may be used in an appropriate amount depending on the type of the acid catalyst. The acid catalyst is preferably used in an amount of 0.001 to 100 parts by mass, and more preferably 0.01 to 10 parts by mass, based on 100 parts by mass of the compound (N1). Examples of a reaction solvent used for polycondensation include methyl isobutyl ketone, tetrahydrofuran, and the like. The reaction (polycondensation) temperature is preferably 20 to 200° C. The reaction time may be appropriately selected depending on the reaction temperature, but is preferably 20 minutes to 72 hours.

Alkynylation Agent

Examples of the alkynylation agent include a compound shown by the following formula (3), and the like.

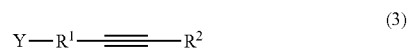

$$Y-R^1-\!\!\equiv\!\!-R^2 \quad (3)$$

wherein $R^1$ and $R^2$ are the same as defined for the formula (2), and Y represents a leaving group.

Examples of the leaving group represented by Y include a chlorine atom, a bromine atom, a tosyl group, a mesyl group, a trifluoromethylsulfonyl group, and the like.

Alkynyloxylation

The polymer may be alkynyloxylated by an appropriate synthesis method (e.g., the method disclosed in Japanese Patent Application Publication (TOKUHYO) No. 2003-533502). For example, the polymer (P1) may be reacted with the alkynylation agent in a reaction solvent in the presence of a basic compound.

Examples of the reaction solvent used for alkynyloxylation include
N-methylpyrrolidone, methyl isobutyl ketone, tetrahydrofuran, and the like.

Examples of the basic compound include amines, metal hydroxides, metal carbonates, metal alkoxides, and the like. Examples of the amines include triethylamine, N,N-diisopropylethylamine, pyridine, N-methylpiperidine, N-methylmorpholine, diazabicycloundecene, and the like. Examples of the metal hydroxides include sodium hydroxide and the like. Among these, the amines and the metal hydroxides are preferable, and diazabicycloundecene is more preferable.

Method 2

The method 2 includes reacting the compound (N1) with the alkynylation agent to obtain the compound (N2), and polymerizing the compound (N2), or polycondensing the compound (N2) with the condensation agent.

Examples of the alkynylation agent used for the method 2 include those mentioned above in connection with the method 1. The compound (N2) may be polycondensed in the same manner as in the method 1.

The polycondensation reaction may be implemented by condensing the compound (N2) or the like with the condensation agent (e.g., aldehyde, ketone, or divinyl compound) in the presence of an acid catalyst.

Examples of the acid catalyst used for polycondensation include mineral acids such as sulfuric acid, phosphoric acid, and perchloric acid; organic sulfonic acids such as p-toluenesulfonic acid; and carboxylic acids such as formic acid and oxalic acid. The acid catalyst may be used in an appropriate amount depending on the type of acid. The acid catalyst is normally used in an amount of 0.001 to 100 parts by mass, and preferably 0.01 to 10 parts by mass, based on 100 parts by mass of the compound (N2).

The reaction (condensation) temperature is normally 20 to 200° C. The reaction time is appropriately determined depending on the reaction temperature, but is normally 20 minutes to 72 hours.

Solvent (B)

The resist underlayer film-forming composition includes the solvent (B). The solvent (B) can dissolve or disperse the polymer (A) therein.

Examples of the solvent (B) include ethylene glycol monoalkyl ethers such as ethylene glycol monomethyl ether, ethylene glycol monoethyl ether, ethylene glycol mono-n-propyl ether, and ethylene glycol mono-n-butyl ether; ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; diethylene glycol dialkyl ethers such as diethylene glycol dimethyl ether, diethylene glycol diethyl ether, diethylene glycol di-n-propyl ether, diethylene glycol di-n-butyl ether; triethylene glycol dialkyl ethers such as triethylene glycol dimethyl ether and triethylene glycol diethyl ether; propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; lactates such as methyl lactate, ethyl lactate, n-propyl lactate, i-propyl lactate, n-butyl lactate, and i-butyl lactate; aliphatic carboxylic acid esters such as methyl formate, ethyl formate, n-propyl formate, i-propyl formate, n-butyl formate, i-butyl formate, n-amyl formate, i-amyl formate, methyl acetate, ethyl acetate, n-propyl acetate, i-propyl acetate, n-butyl acetate, i-butyl acetate, n-amyl acetate, i-amyl acetate, n-hexyl acetate, methyl propionate, ethyl propionate, n-propyl propionate, i-propyl propionate, n-butyl propionate, i-butyl propionate, methyl butyrate, ethyl butyrate, n-propyl butyrate, i-propyl butyrate, n-butyl butyrate, and i-butyl butyrate; other esters such as ethyl hydroxyacetate, ethyl 2-hydroxy-2-methylpropionate, methyl 3-methoxy-2-methyl propionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxypropyl acetate, 3-methoxybutyl acetate, 3-methyl-3-methoxybutyl acetate, 3-methyl-3-methoxybutyl propionate, 3-methyl-3-methoxy-butyl butyrate, methyl acetoacetate, methyl pyruvate, and ethyl pyruvate; aromatic hydrocarbons such as toluene and xylene;

ketones such as methyl ethyl ketone, methyl n-propyl ketone, methyl n-butyl ketone, 2-heptanone, 3-heptanone, 4-heptanone, and cyclohexanone; amides such as N-methylformamide, N,N-dimethylformamide, N-methylacetamide, N,N-dimethyl acetamide, and N-methylpyrrolidone; lactones such as γ-butyrolactone; and the like.

Among these, propylene glycol monomethyl ether acetate, propylene glycol monomethyl ether, ethylene glycol monoethyl ether acetate, ethyl lactate, n-butyl acetate, ethyl 3-ethoxypropionate, methyl 3-methoxypropionate, 2-heptanone, cyclohexanone, and γ-butyrolactone are preferable, and propylene glycol monomethyl ether acetate is more preferable. These solvents (B) may be used either alone or in combination.

The content of the solvent (B) in the resist underlayer film-forming composition is not particularly limited. The solvent (B) is preferably used so that the solid content of the resist underlayer film-forming composition is 0.1 to 30 mass %, and more preferably 1 to 15 mass %. If the solid content of the resist underlayer film-forming composition is within the above range, the resist underlayer film-forming composition can be successfully applied to a substrate.

Acid Generator (C)

The resist underlayer film-forming composition may optionally include the acid generator (C). The acid generator (C) generates an acid upon exposure or heating. The acid generator (C) can prevent poisoning (i.e., an acid contained in the resist is inactivated when a substance (inhibitor) (e.g., a base such as $OH^-$, $CH_3^-$, or $NH_2^-$) that is generated from the substrate (particularly a low-dielectric-constant film) and inhibits a chemical reaction of the resist is diffused into the resist, so that the pattern of the positive-tone resist undergoes footing). Specifically, the acid generator contained in the resulting resist underlayer film reacts with the inhibitor, so that diffusion of the inhibitor into the resist can be prevented.

Examples of the acid generator that generates an acid upon exposure (hereinafter referred to as "photoacid generator") include the compounds disclosed in paragraphs [0076] to [0081] of WO07/105776, and the like.

Among these, diphenyliodonium trifluoromethanesulfonate, diphenyliodonium nonafluoro-n-butanesulfonate, diphenyliodonium pyrenesulfonate, diphenyliodonium n-dodecylbenzenesulfonate, diphenyliodonium 10-camphorsulfonate, diphenyliodonium naphthalenesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium n-dodecylbenzenesulfonate, bis(4-t-butylphenyl)iodonium 10-camphorsulfonate, and bis(4-t-butylphenyl)iodonium naphthalenesulfonate are preferable, and bis(4-t-butylphenyl)iodonium nonafluoro-n-butanesulfonate is more preferable. These photoacid generators may be used either alone or in combination.

Examples of the acid generator that generates an acid upon heating (hereinafter may be referred to as "thermal acid generator") include 2,4,4,6-tetrabromocyclohexadienone, benzointosylate, 2-nitrobenzyl tosylate, alkyl sulfonates, and the like. These thermal acid generators may be used either alone or in combination. The photoacid generator and the thermal acid generator may be used in combination as the acid generator (C).

The acid generator (C) is preferably used in an amount of 100 parts by mass or less, more preferably 0.1 to 30 parts by mass, and particularly preferably 0.1 to 10 parts by mass, based on 100 parts by mass of the polymer (A). If the amount of the acid generator (C) is within the above range, the resist underlayer film-forming composition successfully achieves the above effects.

Crosslinking Agent (D)

The resist underlayer film-forming composition may optionally include the crosslinking agent (D). The resist underlayer film-forming composition that includes the crosslinking agent (D) can be cured at a lower temperature when forming a resist underlayer film.

A polynuclear phenol or a curing agent may be used as the crosslinking agent (D). Examples of the polynuclear phenol include binuclear phenols such as 4,4'-biphenyldiol, 4,4'-methylenebisphenol, 4,4'-ethylidenebisphenol, and bisphenol A; trinuclear phenols such as 4,4',4"-methylidenetrisphenol and 4,4'-[1-[4-[1-(4-hydroxyphenyl)-1-methylethyl]phenyl] ethylidene]bisphenol; polyphenols such as a novolac; and the like. Among these, 4,4'-[1-[4-[1-(4-hydroxyphenyl)-1-methylethyl]phenyl]ethylidene]bisphenol and a novolac are preferable. These polynuclear phenols may be used either alone or in combination.

Examples of the curing agent include diisocyanates such as 2,3-tolylene diisocyanate, 2,4-tolylene diisocyanate, 3,4-tolylene diisocyanate, 3,5-tolylene diisocyanate, 4,4'-diphenylmethane diisocyanate, hexamethylene diisocyanate, and 1,4-cyclohexane diisocyanate, epoxy compounds such as Epikote 812, Epikote 815, Epikote 826, Epikote 828, Epikote 834, Epikote 836, Epikote 871, Epikote 1001, Epikote 1004, Epikote 1007, Epikote 1009, Epikote 1031 (manufactured by Japan Epoxy Resins Co., Ltd.), Araldite 6600, Araldite 6700, Araldite 6800, Araldite 502, Araldite 6071, Araldite 6084, Araldite 6097, Araldite 6099 (manufactured by Ciba-Geigy), DER 331, DER 332, DER 333, DER 661, DER 644, DER 667 (manufactured by Dow Chemical Company); melamine-type curing agents such as Cymel 300, Cymel 301, Cymel 303, Cymel 350, Cymel 370, Cymel 771, Cymel 325, Cymel 327, Cymel 703, Cymel 712, Cymel 701, Cymel 272, Cymel 202, Mycoat 506, Mycoat 508 (manufactured by Nihon Cytec Industries Inc.); benzoguanamine-type curing agents such as Cymel 1123, Cymel 1123-10, Cymel 1128, Mycoat 102, Mycoat 105, Mycoat 106, Mycoat 130 (manufactured by Mitsui Cyanamid); glycoluril-type curing agents such as Cymel 1170, Cymel 1172 (manufactured by Nihon Cytec Industries Inc.), MX-279, Nikalac N-2702 (manufactured by Sanwa Chemical Co., Ltd.); and the like. Among these, the melamine-type curing agents and the glycoluril-type curing agents are preferable, and 1,3,4,6-tetrakis(methoxymethyl) glycoluril is more preferable. These curing agents may be used either alone or in combination. The polynuclear phenol and the curing agent may be used in combination as the crosslinking agent (D).

The crosslinking agent (D) is preferably used in an amount of 100 parts by mass or less, more preferably 1 to 20 parts by mass, and particularly preferably 1 to 10 parts by mass, based on 100 parts by mass of the polymer (A). If the amount of the crosslinking agent (D) is within the above range, the above effects can be achieved without causing a deterioration in performance of a resist underlayer film formed using the resist underlayer film-forming composition.

Additional Optional Component

The resist underlayer film-forming composition may optionally further include an additional optional component such as a thermosetting polymer, a radiation absorber, a surfactant, a preservative, an anti-foaming agent, or an adhesion improver.

Various thermosetting polymers may be used as the thermosetting polymer. The thermosetting polymer is cured upon heating, and becomes insoluble in a solvent to prevent intermixing between the resulting resist underlayer film and a resist film formed on the resist underlayer film. Examples of the thermosetting polymer include acrylic polymers (thermosetting acrylic polymers), phenol polymers, urea polymers, melamine polymers, amino polymers, aromatic hydrocarbon polymers, epoxy polymers, alkyd polymers, and the like. Among these, urea polymers, melamine polymers, and aromatic hydrocarbon polymers are preferable.

The thermosetting polymer is preferably used in amount of 10 parts by mass or less, and more preferably 1 to 5 parts by mass, based on 100 parts by mass of the polymer (A).

Examples of the radiation absorber include dyes such as oil-soluble dyes, disperse dyes, basic dyes, methine dyes, pyrazole dyes, imidazole dyes, and hydroxyazo dyes; fluorescent whitening agents such as bixin derivatives, norbixin, stilbene, 4,4'-diaminostilbene derivatives, cumarin derivatives, and pyrazoline derivatives; UV absorbers such as hydroxyazo dyes, Tinuvin 234 (manufactured by Ciba-Geigy), and Tinuvin 1130 (manufactured by Ciba-Geigy); aromatic compounds such as anthracene derivatives and anthraquinone derivatives; and the like. These radiation absorbers may be used either alone or in combination.

The radiation absorber is preferably used in amount of 50 parts by mass or less, and more preferably 1 to 10 parts by mass, based on 100 parts by mass of the polymer (A).

The surfactant improves applicability, striation, wettability, developability, and the like. Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate, KP341 (manufactured by Shin-Etsu Chemical Co., Ltd.), Polyflow No. 75, Polyflow No. 95 (manufactured by Kyoeisha Chemical Co., Ltd.), FFTOP EF101, FFTOP EF204, FFTOP EF303, FFTOP EF352 (manufactured by JEMCO, Inc.), Megafac F171, Megafac F172, Megafac F173 (manufactured by DIC Corporation), Fluorad FC430, Fluorad FC431, Fluorad FC135, Fluorad FC93 (manufactured by Sumitomo 3M Ltd.), Asahi Guard AG710, Surflon 5382, Surflon SC101, Surflon SC102, Surflon SC103, Surflon SC104, Surflon SC105, Surflon SC106 (manufactured by Asahi Glass Co., Ltd.), and the like. These surfactants may be used either alone or in combination.

The surfactant is preferably used in amount of 15 parts by mass or less, and more preferably 0.001 to 10 parts by mass, based on 100 parts by mass of the polymer (A).

The resist underlayer film-forming composition having the above properties may preferably used to form a pattern on a non-planar substrate. In this case, a hole, a trench (groove), or the like formed in the non-planar substrate can be successfully filled with the resist underlayer film-forming composition.

<Method for Forming Pattern>

A method for forming a pattern according to one embodiment of the invention includes (1) forming a resist underlayer film on a substrate using the resist underlayer film-forming composition according to one embodiment of the invention (hereinafter may be referred to as "step (1)"), (2) forming a resist film on the resist underlayer film using a resist composition (hereinafter may be referred to as "step (2)"), (3) exposing the resist film by applying exposure light to the resist film via a photomask (hereinafter may be referred to as "step (3)"), (4) developing the exposed resist film to form a resist pattern (hereinafter may be referred to as "step (4)"), and (5) sequentially dry-etching the resist underlayer film and the substrate using the resist pattern as a mask (hereinafter may be referred to as "step (5)").

According to the method for forming a pattern according to one embodiment of the invention, the resist pattern can be transferred to the substrate with good reproducibility in the dry-etching process. Each step of the method for forming a pattern according to one embodiment of the invention is described below.

Step (1)

In the step (1), the resist underlayer film is formed on the substrate using the resist underlayer film-forming composition. The resist underlayer film can thus be formed on the substrate.

Examples of the substrate include an insulating film formed of silicon oxide, silicon nitride, silicon oxynitride, a polysiloxane, or the like, or a wafer coated with a low-dielectric-constant insulating film (e.g., Black Diamond (manufactured by AMAT), SiLK (manufactured by Dow Chemical), or Low-k film manufactured by JSR Corporation). A patterned substrate provided with a trench, a via, and the like may also be used.

In the method for forming a pattern according to one embodiment of the invention, a non-planar substrate may suitably used as the substrate. The term "non-planar substrate" used herein refers to a substrate in which a bottomed microhole, a bottomed microtrench, or the like is formed. The bottomed microhole has an aspect ratio (height/diameter) of 0.2 to 50, preferably 0.5 to 20, and more preferably 1 to 10, for example. The bottomed microtrench has an aspect ratio (height/width) of 0.2 to 50, preferably 0.5 to 20, and more preferably 1 to 10, for example. According to the method for forming a pattern according to one embodiment of the invention, a non-planar substrate can be planarized using the resist underlayer film-forming composition having the above properties (i.e., a hole, a trench, or the like formed in a non-planar substrate can be filled with the resist underlayer film-forming composition).

The resist underlayer film-forming composition may be applied to the substrate by an arbitrary method. For example, the resist underlayer film-forming composition may be applied by spin coating or the like. Since a trench formed in the substrate can be filled with the resist underlayer film-forming composition, a given pattern can be formed on the substrate by the etching step described later.

The resist underlayer film may be formed by forming a film on the substrate by applying the resist underlayer film-forming composition to the substrate, and applying light or the like to the film and/or heating the film to cure the film. Light or the like that is applied to the film may be appropriately selected from visible rays, ultraviolet rays, deep ultraviolet rays, X-rays, electron beams, γ-rays, molecular beams, ion beams, and the like depending on the type of the acid generator (C) optionally included in the resist underlayer film-forming composition.

When heating the film formed by applying the resist underlayer film-forming composition, the heating temperature is not particularly limited, but is preferably 90 to 650° C., more preferably 90 to 450° C., and particularly preferably 90 to 350° C.

The thickness of the resist underlayer film formed by the step (1) is not particularly limited, but is preferably 10 to 1000 nm, and more preferably 30 to 500 nm.

The method for forming a pattern according to one embodiment of the invention may optionally further include (1') forming an intermediate layer on the resist underlayer film after the step (1) (hereinafter may be referred to as "step (1')"). The intermediate layer refers to a layer that is provided with a given function required to supplement the functions of the resist underlayer film or the resist film (or to provide the resist underlayer film or the resist film with a desired function) when forming a resist pattern. For example, when forming an antireflective film as the intermediate layer, the intermediate layer can supplement the antireflective function of the resist underlayer film.

The intermediate layer may be formed using an organic compound or an inorganic oxide. Examples of the organic compound include DUV-42, DUV-44, ARC-28, ARC-29 (manufactured by Brewer Science), AR-3, AR-19 (manufactured by Lohm and Haas), and the like. Examples of the inorganic oxide include a spin-on-glass material manufactured by JSR Corporation, a polysiloxane formed by CVD, titanium oxide, alumina, tungsten oxide, and the like.

The intermediate layer may be formed by an arbitrary method. For example, the intermediate layer may be formed by a coating method, CVD, or the like. It is preferable to form the intermediate layer by a coating method. In this case, the intermediate layer can be continuously formed after forming the resist underlayer film.

The thickness of the intermediate layer may be appropriately selected depending on the function required for the intermediate layer. For example, when using a normal lithographic process, the thickness of the intermediate layer is preferably 5 to 3000 nm, and more preferably 10 to 300 nm. If the thickness of the intermediate layer is less than 5 nm, the intermediate layer may be etched away when etching the resist underlayer film. If the thickness of the intermediate layer exceeds 3000 nm, the difference in pattern dimension may increase when transferring the resist pattern to the intermediate layer.

Step (2)

In the step (2), the resist film is formed on the resist underlayer film formed by the step (1) using the resist composition. When the intermediate layer has been formed on the resist underlayer film, the resist film is formed on the intermediate layer.

Examples of the resist composition used in the step (2) include a positive-tone or negative-tone chemically-amplified resist composition that includes a photoacid generator, a positive-tone resist composition that includes an alkali-soluble polymer and a quinone diazide sensitizer, a negative-tone resist composition that includes an alkali-soluble polymer and a crosslinking agent, a silicon-containing resist that includes a silicon atom as the main component, and the like.

The solid content of the resist composition is not particularly limited, but is preferably 5 to 50 mass %. The resist composition may preferably be filtered through a filter having a pore size of about 0.2 μm. A commercially available resist composition may directly be used as the resist composition used for the method for forming a pattern according to one embodiment of the invention.

The resist composition may be applied by an arbitrary method. For example, the resist composition may be applied by spin coating or the like. Note that the amount of the resist composition applied is adjusted so that the resulting resist film has a given thickness.

The resist film may be formed by applying the resist composition to form a film, and prebaking the film to volatilize a solvent (i.e., a solvent included in the resist composition) from the film. The prebaking temperature is appropriately selected depending on the type of the resist composition and the like. The prebaking temperature is preferably 30 to 200°

C., and more preferably 50 to 150° C. The prebaking time is preferably 5 to 600 seconds, and more preferably 10 to 300 seconds.

Step (3)

In the step (3), the resist film obtained by the step (2) is exposed by applying exposure light to the resist film via a photomask.

Exposure light used in the step (3) is appropriately selected from visible rays, ultraviolet rays, deep ultraviolet rays, X-rays, electron beams, γ-rays, molecular beams, ion beams, and the like, depending on the type of acid generator included in the resist composition. It is preferable to use deep ultraviolet rays. It is particularly preferable to use KrF excimer laser light (wavelength: 248 nm), ArF excimer laser light (wavelength: 193 nm), $F_2$ excimer laser light (wavelength: 157 nm), $Kr_2$ excimer laser light (wavelength: 147 nm), ArKr excimer laser light (wavelength: 134 nm), or extreme ultraviolet rays (wavelength: 13 nm, for example). The exposure method is not particularly limited. A known method used when forming a pattern may be employed.

Step (4)

In the step (4), the resist film exposed in the step (3) is developed to form a resist pattern.

A developer used for development may be appropriately selected depending on the type of the resist composition. When using a positive-tone chemically-amplified resist composition or a positive-tone resist composition that includes an alkali-soluble polymer, an alkaline aqueous solution prepared by dissolving sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene, or the like in water may be used as the developer. An appropriate amount of a water-soluble organic solvent, an alcohol (e.g., methanol or ethanol), or a surfactant may be added to the alkaline aqueous solution.

When using a negative-tone chemically-amplified resist composition or a negative-tone resist composition that includes an alkali-soluble polymer, an alkaline aqueous solution prepared by dissolving an inorganic alkali (e.g., sodium hydroxide, potassium hydroxide, sodium carbonate, sodium silicate, sodium metasilicate, or aqueous ammonia), a primary amine (e.g., ethylamine or n-propylamine), a secondary amine (e.g., diethylamine or di-n-butylamine), a tertiary amine (e.g., triethylamine or methyldiethylamine), an alcohol amine (e g , dimethylethanolamine or triethanolamine), a quaternary ammonium salt (e.g., tetramethylammonium hydroxide, tetraethylammonium hydroxide, or choline), a cyclic amine (e.g., pyrrole or piperidine), or the like in water may be used as the developer.

In the step (4), the resist film developed using the developer is rinsed and dried to form a given resist pattern that corresponds to the photomask.

In the step (4), it is preferable to postbake the resist film before development (i.e., after exposure in the step (3)) in order to improve the resolution, pattern profile, developability, and the like. The postbaking temperature is appropriately selected depending on the type of the resist composition and the like. The postbaking temperature is preferably 50 to 200° C., and more preferably 80 to 150° C. The postbaking time is preferably 5 to 600 seconds, and more preferably 10 to 300 seconds.

Step (5)

In the step (5), the resist underlayer film and the substrate are dry-etched using the resist pattern formed by the step (4) as a mask (etching mask) to form a pattern. When the intermediate layer has been formed on the resist underlayer film, the intermediate layer, the resist underlayer film, and the substrate are sequentially dry-etched.

The resist underlayer film and the substrate may be dry-etched using a known dry etching system. As a source gas used for dry-etching, an oxygen-containing gas (e.g., $O_2$, CO, or $CO_2$), an inert gas (e.g., He, $N_2$, or Ar), a chlorine-containing gas (e.g., $Cl_2$ or $BCl_3$), $H_2$, $NH_3$, or the like may be used depending on the elemental composition of the etching target film. Note that these gases may be used in combination.

A desired substrate-processing pattern can be formed by performing the steps (1) to (5). Note that the resist pattern may be formed using a nanoimprint method or the like instead of performing the steps (1) to (4).

EXAMPLES

The invention is further described below by way of examples. Note that the invention is not limited to the following examples.

The weight average molecular weight (Mw) and the dispersity (Mw/Mn) were measured by gel permeation chromatography (detector: differential refractometer) using GPC columns (G2000HXL×2 and G3000HXL×1) manufactured by Tosoh Corporation at a flow rate of 1.0 ml/min and a column temperature of 40° C. (eluant: tetrahydrofuran, standard: monodisperse polystyrene).

Synthesis of Polymer (A)

Synthesis Example 1

(1) Synthesis of Condensate

A separable flask equipped with a thermometer was charged with 10 parts by mass of 1-naphthol, 5 parts by mass of formaldehyde (condensation agent), 1 part by mass of p-toluenesulfonic acid (acid catalyst), and 30 parts by mass of methyl isobutyl ketone (reaction solvent). The mixture was reacted at 50° C. for 5 hours with stirring to obtain a 1-naphthol/formaldehyde condensate (A1). The condensate (A1) had an Mw of 890 and a dispersity (Mw/Mn) of 1.4.

(2) Introduction of Specific Substituent (S1)

A separable flask equipped with a thermometer was charged with 50 parts by mass of the condensate (A1), 100 parts by mass of propargyl bromide (alkynylation agent), 90 parts by mass of diazabicycloundecene (basic compound), and 2000 parts by mass of N-methylpyrrolidone (reaction solvent). The mixture was reacted at 45° C. for 8 hours. After completion of the reaction, the reaction solution was cooled with water to 30° C. or less. The reaction solution was then added to a large quantity of n-heptane. A solid that precipitated by this operation was separated by decantation, and washed with a large quantity of n-heptane. The solid was then dissolved in methyl isobutyl ketone, and washed with a 1 mass % oxalic acid aqueous solution and purified water to remove the residual base component. The solid was then dried at 50° C. for 17 hours to obtain a polymer (a1-1). The polymer (a1-1) had an Mw of 2000 and a dispersity (Mw/Mn) of 1.6.

Synthesis Examples 2 to 28

A condensate was obtained in the same manner as in the step (1) of Synthesis Example 1, except for appropriately changing the reaction time and the reaction temperature. The Mw and the dispersity (Mw/Mn) of the resulting condensate are shown in Table 1 (see "Condensate"). The details of the condensates A1 and A2 in Table 1 are shown below. The specific substituent (S1) was introduced into the condensate, and the resulting product was washed and dried in the same manner as in the step (2) of Synthesis Example 1 to obtain a polymer ((A1 -1) to (A1-12), (A2-1) to (A2-14), (a1-2), (a2-1), and (a2-2)). The Mw and the dispersity (Mw/Mn) of the resulting polymer are shown in Table 1 (see "Specific polymer").

A1: 1-naphthol/formaldehyde condensate (i.e., a polymer including the structural unit shown by the following formula (A-1))

A2: 2,7-naphthalenediol/formaldehyde condensate (i.e., a polymer including the structural unit shown by the following formula (A-2))

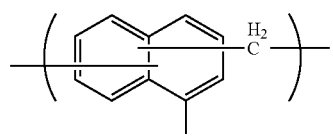

[A-1]

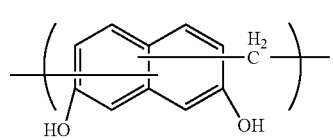

[A-2]

TABLE 1

|  | Condensate | | | Specific polymer | | |
|---|---|---|---|---|---|---|
|  | Type | Molecular weight (×10³) | Mw/Mn | Type | Molecular weight (×10³) | Mw/Mn |
| Synthesis Example 1 | A1 | 0.9 | 1.4 | a1-1 | 2.0 | 1.6 |
| Synthesis Example 2 | A1 | 1.3 | 1.4 | A1-1 | 3.0 | 1.6 |
| Synthesis Example 3 | A1 | 1.3 | 1.2 | A1-2 | 3.0 | 1.3 |
| Synthesis Example 4 | A1 | 1.3 | 2.7 | A1-3 | 3.0 | 3.0 |
| Synthesis Example 5 | A1 | 1.3 | 4.8 | A1-4 | 3.0 | 5.2 |
| Synthesis Example 6 | A1 | 2.2 | 1.4 | A1-5 | 5.0 | 1.6 |
| Synthesis Example 7 | A1 | 2.2 | 1.2 | A1-6 | 5.0 | 1.3 |
| Synthesis Example 8 | A1 | 2.2 | 2.7 | A1-7 | 5.0 | 3.0 |
| Synthesis Example 9 | A1 | 2.2 | 4.8 | A1-8 | 5.0 | 5.2 |
| Synthesis Example 10 | A1 | 4.4 | 1.4 | A1-9 | 10 | 1.6 |
| Synthesis Example 11 | A1 | 4.4 | 1.2 | A1-10 | 10 | 1.3 |
| Synthesis Example 12 | A1 | 4.4 | 2.7 | A1-11 | 10 | 3.0 |
| Synthesis Example 13 | A1 | 4.4 | 3.9 | A1-12 | 10 | 5.2 |
| Synthesis Example 14 | A1 | 5.4 | 1.3 | a1-2 | 12 | 1.6 |
| Synthesis Example 15 | A2 | 0.9 | 1.5 | a2-1 | 2.0 | 1.6 |
| Synthesis Example 16 | A2 | 1.2 | 1.4 | A2-1 | 3.0 | 1.6 |
| Synthesis Example 17 | A2 | 1.2 | 1.2 | A2-2 | 3.0 | 1.3 |
| Synthesis Example 18 | A2 | 1.2 | 2.8 | A2-3 | 3.0 | 3.0 |
| Synthesis Example 19 | A2 | 1.2 | 4.8 | A2-4 | 3.0 | 5.2 |
| Synthesis Example 20 | A2 | 2.1 | 1.4 | A2-5 | 5.0 | 1.6 |
| Synthesis Example 21 | A2 | 2.1 | 1.2 | A2-6 | 5.0 | 1.3 |
| Synthesis Example 22 | A2 | 2.1 | 2.8 | A2-7 | 5.0 | 3.0 |
| Synthesis Example 23 | A2 | 2.1 | 4.8 | A2-8 | 5.0 | 5.2 |
| Synthesis Example 24 | A2 | 4.3 | 1.4 | A2-9 | 10 | 1.6 |
| Synthesis Example 25 | A2 | 4.3 | 1.2 | A2-10 | 10 | 1.3 |
| Synthesis Example 26 | A2 | 4.3 | 2.8 | A2-11 | 10 | 3.0 |
| Synthesis Example 27 | A2 | 4.3 | 3.9 | A2-12 | 10 | 5.2 |
| Synthesis Example 28 | A2 | 5.5 | 1.4 | a2-2 | 12 | 1.6 |

Preparation of Resist Underlayer Film-Forming Composition

Example 1

10 parts by mass of the polymer (A1-1) was dissolved in 90 parts by mass of propylene glycol monomethyl acetate. The solution was filtered through a membrane filter having a pore size of 0.1 μm to obtain a resist underlayer film-forming composition (U-1).

Examples 2 to 24

A resist underlayer film-forming composition ((U-2) to (U-24)) was obtained in the same manner as in Example 1, except for using the polymer (A) shown in Table 2 instead of the polymer (A1-1).

Example 25

10 parts by mass of the polymer (A1-2), 0.5 parts by mass of bis(4-t-butylphenyl)iodonium nonafluoro-n-butane-sulfonate (acid generator (C)), and 1 part by mass of 1,3,4,6-tetrakis(methoxymethyl)glycoluril (compound shown by the following formula) (crosslinking agent (D)) were dissolved in 90 parts by mass of propylene glycol monomethyl acetate. The solution was filtered through a membrane filter having a pore size of 0.1 μm to obtain a resist underlayer film-forming composition (U-25).

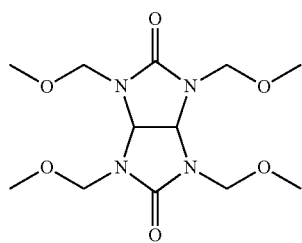

Examples 26 to 28

A resist underlayer film-forming composition ((U-26) to (U-28)) was obtained in the same manner as in Example 25, except for using the components shown in Table 2 in the amounts shown in Table 2.

Comparative Examples 1 to 4

A resist underlayer film-forming composition ((CU-1) to (CU-4)) was obtained in the same manner as in Example 1, except for using the component (A) shown in Table 2 instead of the polymer (A1-1).

Evaluation

The filling capability of the resist underlayer film-forming composition (i.e., the capability of the resist underlayer film-forming composition to fill via-holes formed in a non-planar substrate), and the outgas suppression capability (i.e., the amount of sublimates) of the resist underlayer film-forming composition when forming a resist underlayer film were evaluated by the following methods. The evaluation results are shown in Table 2.

Filling Capability

The filling capability was evaluated by determining whether or not via-holes were successfully filled with the resist underlayer film-forming composition. The filling capability was evaluated as described below.

The resist underlayer film-forming composition was spin-coated onto each substrate (substrates 1 and 2 shown below).

<Substrate 1>
Tetraethylorthosilicate (TEOS) substrate in which via-holes having a size of 140 nm and a depth of 1000 nm were formed at a pitch of 1H/1.2S <Substrate 2>
Tetraethylorthosilicate (TEOS) substrate in which via-holes having a size of 140 nm and a depth of 500 nm were formed at a pitch of 1H/1.2S The resist underlayer film-forming composition was then heated at 250° C. for 60 seconds on a hot plate. A resist underlayer film having a thickness of 300 nm was thus formed in the via-holes formed in the substrate and on the surface of the substrate. The filling state of ten randomly selected via-holes formed in each substrate was observed using a scanning electron microscope, and evaluated in accordance with the following standard.

AA: The resist underlayer film was formed in each via-hole formed in each substrate (i.e., each via-hole was filled with the resist underlayer film).

A: The resist underlayer film was formed in each via-hole formed in the substrate 2, but was not formed in at least one via-hole formed in the substrate 1.

B: The resist underlayer film was not formed in at least one via-hole formed in each substrate.

Outgas Suppression Capability

The resist underlayer film-forming composition was spin-coated onto an 8-inch silicon wafer. The resist underlayer film-forming composition was heated at 180° C. for 60 seconds, and then heated at 250° C. for 60 seconds on a hot plate to form a resist underlayer film having a thickness of 300 nm. The amount of sublimates was measured during this process. Another 8-inch silicon wafer was attached to the top plate of the hot plate, and the mass of sublimates deposited on the 8-inch silicon wafer was measured after applying the resist underlayer film-forming composition 100 times. A case where the amount of sublimates was 1.5 mg or less was evaluated as "AA", a case where the amount of sublimates was more than 1.5 mg and 2.5 mg or less was evaluated as "A", and a case where the amount of sublimates was more than 2.5 mg was evaluated as "B".

TABLE 2

| | Resist underlayer film-forming composition | Component (A) | | Acid generator (C) | Crosslinking agent (D) | Evaluation results | |
|---|---|---|---|---|---|---|---|
| | | Type | Parts by mass | Parts by mass | Parts by mass | Filling capability | Outgas suppression capability |
| Example 1 | U-1 | A1-1 | 10 | — | — | AA | AA |
| Example 2 | U-2 | A1-2 | 10 | — | — | A | AA |
| Example 3 | U-3 | A1-3 | 10 | — | — | AA | AA |
| Example 4 | U-4 | A1-4 | 10 | — | — | AA | A |
| Example 5 | U-5 | A1-5 | 10 | — | — | AA | AA |
| Example 6 | U-6 | A1-6 | 10 | — | — | A | AA |
| Example 7 | U-7 | A1-7 | 10 | — | — | AA | AA |
| Example 8 | U-8 | A1-8 | 10 | — | — | AA | A |
| Example 9 | U-9 | A1-9 | 10 | — | — | AA | AA |
| Example 10 | U-10 | A1-10 | 10 | — | — | A | AA |
| Example 11 | U-11 | A1-11 | 10 | — | — | AA | AA |
| Example 12 | U-12 | A1-12 | 10 | — | — | AA | A |
| Example 13 | U-13 | A2-1 | 10 | — | — | AA | AA |
| Example 14 | U-14 | A2-2 | 10 | — | — | A | AA |
| Example 15 | U-15 | A2-3 | 10 | — | — | AA | AA |
| Example 16 | U-16 | A2-4 | 10 | — | — | AA | A |
| Example 17 | U-17 | A2-5 | 10 | — | — | AA | AA |
| Example 18 | U-18 | A2-6 | 10 | — | — | A | AA |
| Example 19 | U-19 | A2-7 | 10 | — | — | AA | AA |
| Example 20 | U-20 | A2-8 | 10 | — | — | AA | A |

TABLE 2-continued

| | Resist under-layer film-forming composition | Component (A) Type | Component (A) Parts by mass | Acid generator (C) Parts by mass | Crosslinking agent (D) Parts by mass | Evaluation results Filling capability | Evaluation results Outgas suppression capability |
|---|---|---|---|---|---|---|---|
| Example 21 | U-21 | A2-9 | 10 | — | — | AA | AA |
| Example 22 | U-22 | A2-10 | 10 | — | — | A | AA |
| Example 23 | U-23 | A2-11 | 10 | — | — | AA | AA |
| Example 24 | U-24 | A2-12 | 10 | — | — | AA | A |
| Example 25 | U-25 | A1-2 | 10 | 0.5 | 1 | AA | AA |
| Example 26 | U-26 | A1-2 | 10 | 0.5 | 0.5 | AA | AA |
| Example 27 | U-27 | A2-5 | 10 | 0.5 | 1 | AA | AA |
| Example 28 | U-28 | A2-5 | 10 | 0.5 | 0.5 | AA | AA |
| Comparative Example 1 | CU-1 | a1-1 | 10 | — | — | AA | B |
| Comparative Example 2 | CU-2 | a1-2 | 10 | — | — | B | AA |
| Comparative Example 3 | CU-3 | a2-1 | 10 | — | — | AA | B |
| Comparative Example 4 | CU-4 | a2-2 | 10 | — | — | B | AA |

As is clear from Table 2, an excellent filling capability was obtained, and generation of outgas was suppressed (i.e., the amount of sublimates was small) in Examples 1 to 28 in which the resist underlayer film-forming composition according to the embodiments of the invention was used. In Examples 1, 3, 5, 7, 9, 11, 13, 15, 17, 19, 21, 23, 27, and 28 in which the polymer having a dispersity (Mw/Mn) within the preferable range was used, an improvement in filling capability and suppression of outgas were achieved in a more well-balanced manner.

The resist underlayer film-forming composition and the method for forming a pattern according to the embodiments of the invention can thus form a resist underlayer film that exhibits excellent etching resistance, achieve an excellent filling capability when using a non-planar substrate, and reduce generation of outgas when forming the resist underlayer film. Therefore, the resist underlayer film-forming composition and the method for forming a pattern according to the embodiments of the invention are expected to achieve an increase in yield during microfabrication employed in a lithographic process (particularly production of integrated circuit devices).

Obviously, numerous modifications and variations of the invention are possible in light of the above teachings. It is therefore to be understood that within the scope of the appended claims, the invention may be practiced otherwise than as specifically described herein.

What is claimed is:

1. A resist underlayer film-forming composition comprising:
a polymer comprising a structural unit shown by a formula (1), and having a polystyrene-reduced weight average molecular weight of from 3000 to 10000; and
a solvent,

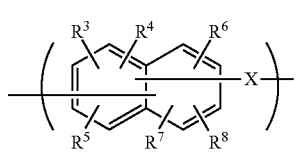
(1)

wherein
each of $R^3$ to $R^8$ independently represents a group shown by a formula (2), a hydrogen atom, a hydroxyl group, a substituted or unsubstituted alkyl group having 1 to 6 carbon atoms, a substituted or unsubstituted alkoxy group having 1 to 6 carbon atoms, a substituted or unsubstituted alkoxycarbonyl group having 2 to 10 carbon atoms, a substituted or unsubstituted aryl group having 6 to 14 carbon atoms, or a substituted or unsubstituted glycidyl ether group having 3 to 6 carbon atoms, wherein at least one of $R^3$ to $R^8$ represents the group shown by the formula (2), and
X represents a substituted or unsubstituted alkanediyl group having 1 to 10 carbon atoms, a substituted or unsubstituted cycloalkanediyl group having 3 to 20 carbon atoms, a substituted or unsubstituted alkanediyloxy group having 1 to 10 carbon atoms, a substituted or unsubstituted cycloalkanediyloxy group having 3 to 20 carbon atoms, a substituted or unsubstituted arenediyl group having 6 to 14 carbon atoms, or a divalent group formed by an arbitrary combination thereof,

(2)

wherein
$R^1$ represents a single bond, a substituted or unsubstituted alkanediyl group having 1 to 20 carbon atoms, or a substituted or unsubstituted arenediyl group having 6 to 20 carbon atoms, and
$R^2$ represents a hydrogen atom, a substituted or unsubstituted alkyl group having 1 to 20 carbon atoms, or a substituted or unsubstituted aryl group having 6 to 20 carbon atoms.

2. The resist underlayer film-forming composition according to claim 1, wherein the polymer has a dispersity of 1.4 to 5.0.

3. The resist underlayer film-forming composition according to claim 1, further comprising an acid generator.

4. The resist underlayer film-forming composition according to claim 1, further comprising a crosslinking agent.

5. The resist underlayer film-forming composition according to claim 1, the resist underlayer film-forming composition being used to form a pattern on a non-planar substrate.

6. A method for forming a pattern comprising:
provide a resist underlayer film on a substrate using the resist underlayer film-forming composition according to claim 1;
providing a resist film on the resist underlayer film using a resist composition;
exposing the resist film by applying exposure light to the resist film through a photomask;
developing the exposed resist film to form a resist pattern; and
sequentially dry-etching the resist underlayer film and the substrate using the resist pattern as a mask.

7. The method according to claim 6, wherein the substrate is a non-planar substrate.

* * * * *